(12) United States Patent
Arayama

(10) Patent No.: US 12,033,907 B2
(45) Date of Patent: Jul. 9, 2024

(54) SEMICONDUCTOR ENCAPSULATION MATERIAL AND SEMICONDUCTOR DEVICE

(71) Applicant: Panasonic Intellectual Property Management Co., Ltd., Osaka (JP)

(72) Inventor: Chika Arayama, Mie (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 396 days.

(21) Appl. No.: 17/431,624

(22) PCT Filed: Feb. 7, 2020

(86) PCT No.: PCT/JP2020/004707
§ 371 (c)(1),
(2) Date: Aug. 17, 2021

(87) PCT Pub. No.: WO2020/170847
PCT Pub. Date: Aug. 27, 2020

(65) Prior Publication Data
US 2022/0037221 A1    Feb. 3, 2022

(30) Foreign Application Priority Data
Feb. 21, 2019    (JP) ................. 2019-029919

(51) Int. Cl.
*H01L 23/29*    (2006.01)
*C08G 59/62*    (2006.01)
(Continued)

(52) U.S. Cl.
CPC ............ *H01L 23/29* (2013.01); *C08G 59/621* (2013.01); *H01L 23/3114* (2013.01); *C08K 3/013* (2018.01)

(58) Field of Classification Search
CPC ... H01L 2924/181; H01L 23/295; C08L 63/00
See application file for complete search history.

(56) References Cited

U.S. PATENT DOCUMENTS

| | | | | |
|---|---|---|---|---|
| 2004/0000728 | A1* | 1/2004 | Kurafuchi | ............... C08L 63/00 257/788 |
| 2012/0235751 | A1* | 9/2012 | Ueda | ................... H03F 3/45183 257/E23.116 |

(Continued)

FOREIGN PATENT DOCUMENTS

| | | |
|---|---|---|
| JP | 2013-008896 | 1/2013 |
| JP | 2017-195319 | 10/2017 |
| JP | 2018-133536 | 8/2018 |
| JP | 2018-170500 | 11/2018 |
| JP | 2018-188494 | 11/2018 |
| WO | 2015/045846 | 4/2015 |

OTHER PUBLICATIONS

Official Communication issued in International Patent Application No. PCT/JP2020/004707, dated Apr. 21, 2020, along with an English translation thereof.

*Primary Examiner* — Jay C Chang
*Assistant Examiner* — Mikka Liu
(74) *Attorney, Agent, or Firm* — GREENBLUM & BERNSTEIN, P.L.C.

(57) ABSTRACT

A semiconductor encapsulation material is used to fabricate a semiconductor device. The semiconductor device includes a semiconductor chip and an encapsulating portion. The encapsulating portion is made of a cured product of the semiconductor encapsulation material. The encapsulating portion encapsulates the semiconductor chip. A stress index (SI), given by the following Formula (1), of the semiconductor encapsulation material is equal to or more than 8500. If a volume of the semiconductor chip is represented by Vc and a total volume of the semiconductor chip and the encapsulating portion is represented by Va, the volume Vc and the total volume Va satisfy the following Formula (2). In (Continued)

Formula (1), E' (T) represents a storage modulus, CTE (T) represents a coefficient of thermal expansion, and Mold temp. represents a molding temperature.

$$SI = \int_{35°C.}^{Mold\ temp.} [E'(T) \times CTE(T)]dT \qquad (1)$$

$$\frac{Vc}{Va} \geqq 0.3. \qquad (2)$$

6 Claims, 4 Drawing Sheets

(51) Int. Cl.
  *H01L 23/31* (2006.01)
  *C08K 3/013* (2018.01)

(56) References Cited

U.S. PATENT DOCUMENTS

2016/0211228 A1 7/2016 Morita et al.
2017/0025321 A1* 1/2017 Homma .............. H01L 23/3142

* cited by examiner

SEMICONDUCTOR ENCAPSULATION MATERIAL AND SEMICONDUCTOR DEVICE

CROSS-REFERENCE TO RELATED APPLICATIONS

This application is a National Stage of International Application No. PCT/JP2020/004707 filed Feb. 7, 2020, claiming priority to Japanese Patent Application No. 2019-029919 filed Feb. 21, 2019, the contents of both applications are incorporated herein by reference in their entirety.

TECHNICAL FIELD

The present disclosure generally relates to a semiconductor encapsulation material and a semiconductor device, and more particularly relates to a semiconductor encapsulation material used for fabricating a semiconductor device and a semiconductor device.

BACKGROUND ART

A solder ball of a semiconductor package is melted by a reflow process, and then the semiconductor package is mounted on a printed wiring board by soldering. Lead-free solder is used as a material for the solder ball. This causes the temperature of the reflow process to reach a high temperature of 260° C. or more. Therefore, reducing warpage of the semiconductor package over a broad range from an ordinary temperature to a high temperature of about 260° C. is required.

Warpage behavior of a semiconductor package may be controlled to some extent by using a semiconductor encapsulation material having physical properties adjusted to the structure of the semiconductor package. For example, the warpage behavior of the semiconductor package may be controlled to some extent by adjusting a mold shrinkage factor of the semiconductor encapsulation material in accordance with the structure of the semiconductor package in terms of its own size and the size of its chip.

Nowadays, the sizes and thicknesses of semiconductor packages have been reduced by various packaging methods. Two types of packages, such as a Wafer Level Package (WLP) and a thin Flip Chip-Chip Size Package (FC-CSP) may be cited as typical forms of such semiconductor packages.

Patent Literature 1 discloses a warpage reducing material for a Fan Out Wafer Level Package (FO-WLP). The warpage reducing material is made of a curable resin composition including a component which may be cured by an active energy ray and heat. When the warpage reducing material is cured by an active energy ray and heat to turn into a flat film of a cured product, the coefficient of linear expansion a at 25° C. (ppm/° C.), modulus of elasticity β at 25° C. (GPa), and thickness γ (μm) of the cured product satisfy the following relational formula: 2000≤α×β×γ≤10000.

However, the warpage reducing material of Patent Literature 1 may be used only in FO-WLP. Therefore, it is difficult for the warpage reducing material of Patent Literature 1 to reduce the warpage of the FC-CSP described above. Particularly in the FC-CSP, the volume occupancy of a semiconductor chip in a semiconductor package is significantly higher than in the known FC-CSP. Thus, it has become virtually impossible more and more often to establish correlation between the warpage behavior of the semiconductor package and the mold shrinkage factor of the semiconductor encapsulation material.

CITATION LIST

Patent Literature

Patent Literature 1: JP 2018-170500 A

SUMMARY OF INVENTION

An object of the present disclosure is to provide a semiconductor encapsulation material and a semiconductor device, both of which contribute to reducing the warpage of semiconductor devices.

A semiconductor encapsulation material according to an aspect of the present disclosure is used to fabricate a semiconductor device. The semiconductor device includes a semiconductor chip and an encapsulating portion. The encapsulating portion is made of a cured product of the semiconductor encapsulation material. The encapsulating portion encapsulates the semiconductor chip. A stress index (SI), given by the following Formula (1), of the semiconductor encapsulation material is equal to or more than 8500:

$$SI = \int_{35°C}^{Mold\ temp.} [E'(T) \times CTE(T)] dT \qquad (1).$$

In Formula (1), E' (T) represents a storage modulus, CTE (T) represents a coefficient of thermal expansion, and Mold temp. represents a molding temperature.

If a volume of the semiconductor chip is represented by Vc and a total volume of the semiconductor chip and the encapsulating portion is represented by Va, the volume Vc and the total volume Va satisfy the following Formula (2):

$$\frac{Vc}{Va} \geq 0.3. \qquad (2)$$

A semiconductor encapsulation material according to another aspect of the present disclosure includes a semiconductor chip and an encapsulating portion encapsulating the semiconductor chip. The encapsulating portion is made of a cured product of the semiconductor encapsulation material.

DESCRIPTION OF EMBODIMENTS

(1) Overview

A semiconductor encapsulation material according to this embodiment is used to fabricate a semiconductor device 1.

Figure 1:
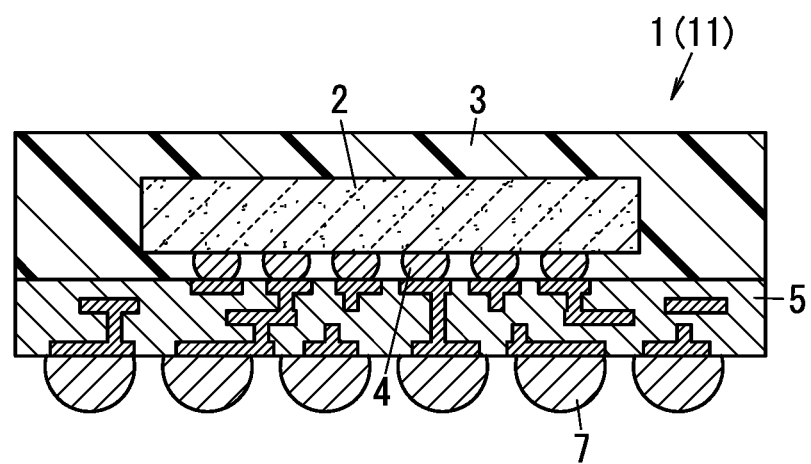
FIG. 1 is a schematic cross-sectional view of a semiconductor device (first semiconductor device implemented as an FC-CSP) according to an exemplary embodiment of the present disclosure.

The semiconductor device 1 includes a semiconductor chip 2 and an encapsulating portion 3 (e.g., see FIG. 1). The encapsulating portion 3 is made of a cured product of the semiconductor encapsulation material. The encapsulating portion 3 encapsulates the semiconductor chip 2.

A stress index (SI), given by the following Formula (1), of the semiconductor encapsulation material is equal to or more than 8500:

$$SI = \int_{35°C}^{Mold\ temp.} [E'(T) \times CTE(T)] dT \quad (1).$$

In Formula (1), E' (T) represents a storage modulus, CTE (T) represents a coefficient of thermal expansion, and Mold temp. represents a molding temperature.

Moreover, if the volume of the semiconductor chip 2 is represented by Vc and the total volume of the semiconductor chip 2 and the encapsulating portion 3 is represented by Va, then Vc and Va satisfy the following Formula (2):

$$\frac{Vc}{Va} \geq 0.3. \quad (2)$$

In the semiconductor encapsulation material according to this embodiment, the encapsulating portion 3 may acquire significant shrinkage force since the stress index (SI) is equal to or more than 8500. This allows the semiconductor encapsulation material according to this embodiment to reduce the warpage of the semiconductor device.

(2) Details

A semiconductor device 1 (semiconductor package) will be described first and then a semiconductor encapsulation material will be described.

(2.1) Semiconductor Device (2.1.1) First Embodiment

FIG. 1 shows a semiconductor device 1 (hereinafter referred to as a "first semiconductor device 11") according to this embodiment. The first semiconductor device 11 includes a semiconductor chip 2, an encapsulating portion 3, and a substrate 5. The first semiconductor device 11 is implemented as a Flip Chip-Chip Size Package (FC-CSP).

The semiconductor chip 2 is a flip chip in a generally rectangular parallelepiped shape. That is to say, the semiconductor chip 2 is a bare semiconductor chip as a functional unit which has been cut off a wafer. The semiconductor chip 2 includes solder bumps 4 arranged in matrix and used as connection terminals.

The dimensions of the semiconductor chip 2 are not limited to particular ones. Specifically, the length of the semiconductor chip 2 may fall, for example, within the range from 5 mm to 30 mm. The width of the semiconductor chip 2 may fall, for example, within the range from 5 mm to 30 mm. The thickness (DT) of the semiconductor chip 2 (excluding the solder bumps 4) may fall, for example, within the range from 50 μm to 500 μm.

The encapsulating portion 3 encapsulates the semiconductor chip 2. The encapsulating portion 3 is bonded to the substrate 5. The encapsulating portion 3 is made of a cured product of the semiconductor encapsulation material. The external shape of the encapsulating portion 3 is a generally rectangular parallelepiped shape.

The external dimensions of the encapsulating portion 3 are not limited to particular ones. Specifically, the length of the encapsulating portion 3 may fall, for example, within the range from 6 mm to 35 mm. The width of the encapsulating portion 3 may fall, for example, within the range from 6 mm to 35 mm. The thickness (MT) of the encapsulating portion 3 may fall, for example, within the range from 0.15 mm to 0.5 mm.

The substrate 5 is also called a package substrate or an interposer. Although the substrate 5 is not limited to particular ones, an ETS (Embedded Trace Substrate) may be given as an example of the substrate 5. The ETS is a substrate with built-in conductor wiring. The ETS may also be a coreless substrate. The coreless substrate is a substrate made of only a buildup layer. The thickness (ST) of the substrate 5 is not particularly limited, but may fall, for example, within the range from 0.1 mm to 0.3 mm.

The semiconductor chip 2 is flip-chip mounted (and bonded) (facedown mounted) to the substrate 5. Specifically, the solder bumps 4 of the semiconductor chip 2 are bonded to the land of the substrate 5. Solder balls 7, which are used as connection terminals, are arranged in matrix on a surface, on which the semiconductor chip 2 is not mounted, of the substrate 5.

The volume occupancy of the semiconductor chip 2 is defined as the volume percentage of the semiconductor chip 2 with respect to the total volume of the semiconductor chip 2 and the encapsulating portion 3. Specifically, if the volume of the semiconductor chip 2 is represented by Vc and the total volume of the semiconductor chip 2 and the encapsulating portion 3 is represented by Va, then the volume occupancy of the semiconductor chip 2 is represented by Vc/Va. In this embodiment, Vc and Va satisfy the following Formula (2):

$$\frac{Vc}{Va} \geq 0.3. \quad (2)$$

That is to say, in this embodiment, the volume occupancy of the semiconductor chip 2 is 30% by volume or more with respect to the total volume of the semiconductor chip 2 and the encapsulating portion 3. When the semiconductor device 1 satisfying such a condition is fabricated, the semiconductor encapsulation material according to this embodiment is used advantageously.

A lower limit value of the volume occupancy of the semiconductor chip 2 is preferably 35% by volume or more, more preferably 40% by volume or more, and even more preferably 45% by volume or more. As can be seen, as the lower limit value of the volume occupancy of the semiconductor chip 2 increases, the volume occupancy of the encapsulating portion 3 decreases accordingly. This facilitates reducing the size and thickness of the first semiconductor device 11.

On the other hand, an upper limit value of the volume occupancy of the semiconductor chip 2 is preferably 70% by volume or less, more preferably 65% by volume or less, and even more preferably 60% by volume or less. As can be seen, as the upper limit value of the volume occupancy of the semiconductor chip 2 decreases, the volume occupancy of the encapsulating portion 3 increases accordingly. This allows producing larger shrinkage force, and thus facilitates reducing the warpage of the first semiconductor device 11.

(2.1.2) Second Embodiment

Figure 2:
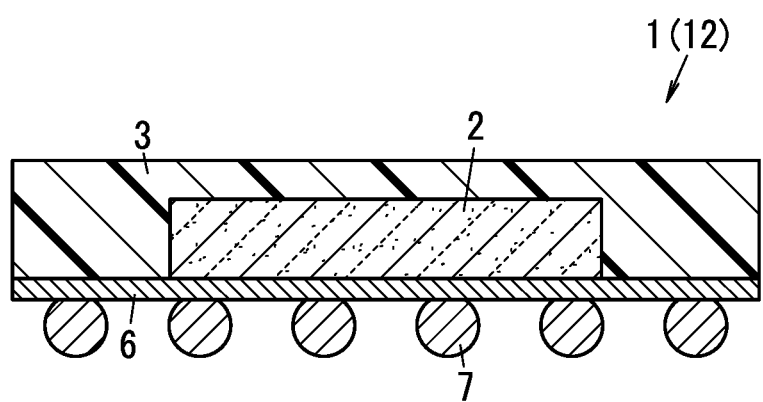
FIG. 2 is a schematic cross-sectional view of a semiconductor device (second semiconductor device implemented as a WLP) according to an exemplary embodiment of the present disclosure.

FIG. 2 shows a semiconductor device 1 (hereinafter referred to as a "second semiconductor device 12") according to a second embodiment. The second semiconductor device 12 includes a semiconductor chip 2, an encapsulating portion 3, and a rewiring layer 6. The second semiconductor device 12 is implemented as a Wafer Level Package (WLP). The rewiring layer 6 is formed by extending wires from terminals of the semiconductor chip 2 using a wafer process. Therefore, the second semiconductor device 12 does not include a substrate 5. Moreover, the semiconductor chip 2 does not include solder bumps 4, either. Since the second semiconductor device 12 has the same configuration in the other respects as the first embodiment described above, the description thereof will be omitted herein.

(2.1.3) Third Embodiment

Figure 3:
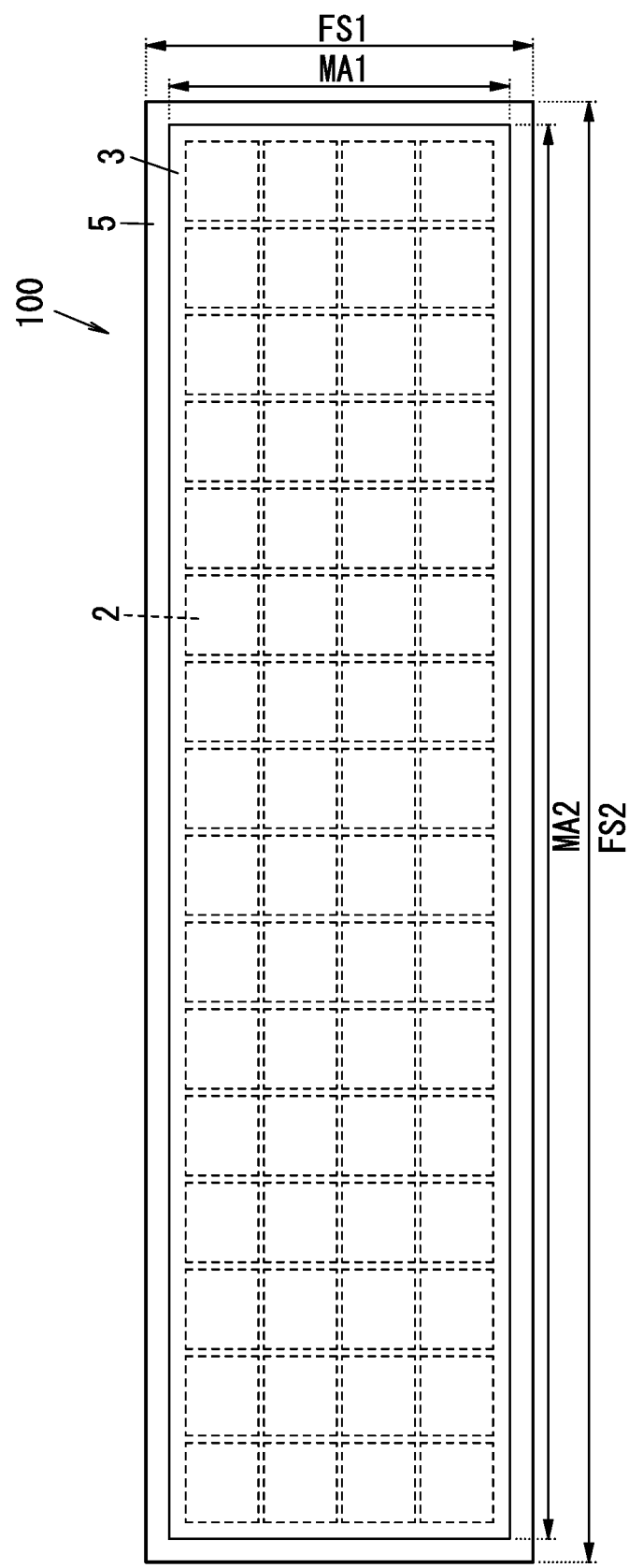
FIG. 3 is a schematic plan view of a substrate assembly according to an exemplary embodiment of the present disclosure.
Figure 4:
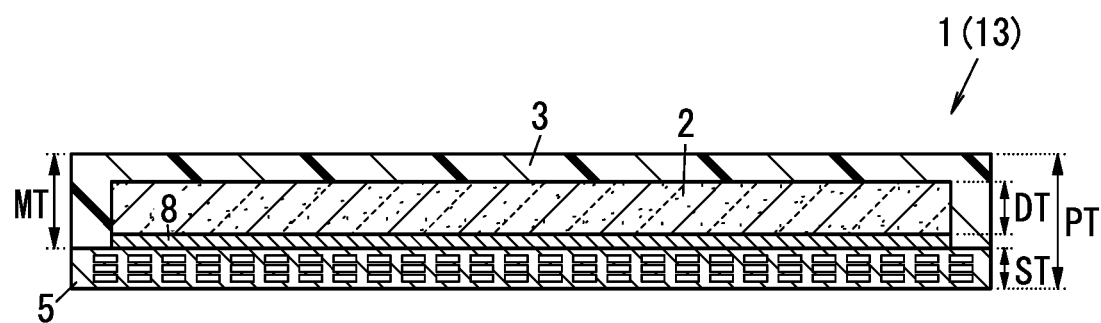
FIG. 4 is a schematic cross-sectional view of a semiconductor device which is obtained by dicing the substrate assembly into pieces.

FIG. 3 shows a substrate assembly 100 according to a third embodiment. FIG. 4 shows a semiconductor device 1 (hereinafter referred to as a "third semiconductor device 13") according to this embodiment. The plurality of third semiconductor devices 13 are obtained when the substrate assembly 100 is diced into multiple pieces. That is to say, the third semiconductor device 13 is formed by what is called a MAP (Mold Array Process). In the MAP process, the substrate assembly 100 is obtained by mounting a plurality of semiconductor chips 2 on one surface of a single substrate 5 such that each product area includes one of the semiconductor chips 2 and by collectively encapsulating these semiconductor chips 2 with a semiconductor encapsulation material. Then, the third semiconductor devices 13 are obtained by cutting (dicing) the substrate assembly 100 into the same number of pieces as the product areas. In the following description, any constituent element having the same configuration as the first embodiment described above will not be described all over again, and only the differences from the first embodiment will be described.

The substrate assembly 100 includes the plurality of semiconductor chips 2, the encapsulating portion 3, and the substrate 5.

The external dimensions of the substrate 5 are not limited to particular ones. The length (FS2) of the substrate 5 may fall, for example, within the range from 100 mm to 300 mm. The width (FS1) of the substrate 5 may fall, for example, within the range from 30 mm to 80 mm.

The dimensions of each semiconductor chip 2 are the same as the ones described for the first embodiment. The plurality of semiconductor chips 2 are arranged in matrix on one surface of the single substrate 5 and bonded thereto with a die attach film 8. The thickness of the die attach film 8 is not particularly limited, but may fall, for example, within the range from 10 μm to 30 μm.

The encapsulating portion 3 encapsulates the plurality of semiconductor chips 2. The encapsulating portion 3 is bonded to the substrate 5. The encapsulating portion 3 is made of a cured product of the semiconductor encapsulation material. The external shape of the encapsulating portion 3 is a generally rectangular parallelepiped shape.

The external dimensions of the encapsulating portion 3 are not limited to particular ones. Specifically, the length (MA2) of the encapsulating portion 3 may fall, for example, within the range from 90 mm to 290 mm. The width (MA1) of the encapsulating portion 3 may fall, for example, within the range from 25 mm to 75 mm.

In the substrate assembly 100, the volume occupancy of the plurality of semiconductor chips 2 is defined as the volume percentage of the plurality of semiconductor chips 2 with respect to the total volume of the plurality of semiconductor chips 2 and the encapsulating portion 3. In this embodiment, the volume occupancy of the plurality of semiconductor chips 2 is 30% by volume or more with respect to the total volume of the plurality of semiconductor chips 2 and the encapsulating portion 3. Note that the volume occupancy of the plurality of semiconductor chips 2 in the substrate assembly 100 is lower than the volume occupancy of the single semiconductor chip 2 in the third semiconductor device 13. This is because the substrate assembly 100 has a scribe line (cutting allowance) for cutting.

A lower limit value of the volume occupancy of the plurality of semiconductor chips 2 is preferably 32% by volume or more, more preferably 35% by volume or more, and even more preferably 38% by volume or more. As can be seen, as the lower limit value of the volume occupancy of the plurality of semiconductor chips 2 increases, the volume occupancy of the encapsulating portion 3 decreases accordingly. This facilitates reducing the size and thickness of the substrate assembly 100. This also facilitates reducing the size and thickness of the third semiconductor device 13.

On the other hand, an upper limit value of the volume occupancy of the plurality of semiconductor chips 2 is preferably 70% by volume or less, more preferably 65% by volume or less, and even more preferably 60% by volume or less. As can be seen, as the upper limit value of the volume occupancy of the plurality of the semiconductor chips 2 decreases, the volume occupancy of the encapsulating portion 3 increases accordingly. This allows producing larger shrinkage force, and thus facilitates reducing the warpage of the substrate assembly 100. This also facilitates reducing the warpage of the third semiconductor device 13.

In the substrate assembly 100, the plurality of third semiconductor devices 13 are obtained when each pair of adjacent semiconductor chips 2 are cut off and diced into multiple pieces. The volume occupancy of the semiconductor chip 2 of the third semiconductor device 13 is the same as the one described for the first embodiment.

(2.2) Semiconductor Encapsulation Material

The semiconductor encapsulation material according to this embodiment is used to fabricate the semiconductor device 1. Embodiments of the semiconductor device 1 include the first semiconductor device 11, the second semiconductor device 12, the third semiconductor device 13, and the substrate assembly 100. The semiconductor encapsulation material is used to form the encapsulating portion 3.

A stress index (SI) of the semiconductor encapsulation material may be obtained by the following Formula (1):

$$SI = \int_{35°C}^{Mold\ temp.} [E'(T) \times CTE(T)] dT \qquad (1).$$

In Formula (1), E' (T) represents a storage modulus, CTE (T) represents a coefficient of thermal expansion, and Mold temp. represents a molding temperature.

A storage modulus E' (T) in Formula (1) is a function of a temperature and may be measured by dynamic mechanical analysis (DMA). In that case, the unit of the storage modulus (E' (T)) is GPa. Meanwhile, a coefficient of thermal expansion (CTE (T)) in Formula (1) is a function of a temperature and may be measured by thermal mechanical analysis (TMA). In that case, the unit of the coefficient of thermal expansion (CTE (T)) is ppm/° C. The molding temperature may be, but does not have to be, 175° C., for example. Note that the stress index (SI) is evaluation index and has no particular unit.

As described above, the stress index (SI) is a value obtained by integrating the function of a temperature, obtained as the product of the storage modulus (E' (T)) and the coefficient of thermal expansion (CTE (T)), in the range from 35° C. to the molding temperature. Therefore, the effect of glass transition temperature (Tg) of the semiconductor encapsulation material is taken into account in the stress index (SI). For this reason, the stress index (SI) allows the shrinkage force of the encapsulating portion 3 of the semiconductor device 1 to be evaluated more accurately.

The stress index (SI) is an index to be used effectively for evaluating the warpage behavior of a type of semiconductor device 1, of which the semiconductor chip 2 has a high volume occupancy, among other things. Specifically, the stress index (SI) is usable particularly effectively for evaluating the warpage behavior of the semiconductor device 1, of which the semiconductor chip 2 has a volume occupancy of 30% by volume or more. In addition, the stress index (SI) is effectively usable for evaluating the warpage behavior of the first semiconductor device 11, in particular.

Specifically, the stress index (SI), given by Formula (1), of the semiconductor encapsulation material is equal to or more than 8500. This allows the encapsulating portion 3 to acquire significant shrinkage force, thus reducing the warpage of the semiconductor device 1. In particular, in the first semiconductor device 11, so-called "convex warpage (also called "cry warpage") is likely to be caused due to a mismatch in coefficient of thermal expansion between the semiconductor chip 2 and the substrate 5. Nonetheless, if the stress index (SI) is equal to or more than 8500, the encapsulating portion 3 may acquire significant shrinkage force even if the volume occupancy of the encapsulating portion 3 is small. This may reduce the convex warpage of the first semiconductor device 11.

The stress index (SI) may be obtained analytically by Formula (1) but may also be obtained numerically. To obtain the stress index (SI) numerically, for each of the storage modulus (E' (T)) and the coefficient of thermal expansion (CTE (T)), measured values are obtained at a constant step (e.g., steps in 5° C.) from 35° C. to the molding temperature. Next, the respective measured values of the storage modulus (E' (T)) and the coefficient of thermal expansion (CTE (T)) at the same temperature are multiplied together to obtain a product. Finally, the produces are integrated together to obtain the stress index (SI).

To obtain the stress index (SI) numerically, measured values are preferably obtained at a step of 5° C. from 35° C. to the molding temperature (175° C.). In this case, the lower limit value of the stress index (SI) is preferably 8500 or more, more preferably 8600 or more, and even more preferably 8700 or more. Meanwhile, the upper limit value of the stress index (SI) is preferably 17000 or less, more preferably 16000 or less, and even more preferably 15000 or less.

The semiconductor encapsulation material may contain a thermosetting resin. The thermosetting resin is not limited to particular ones, but may include an epoxy resin based curing agent and a phenolic resin based curing agent. Although the epoxy resin is not limited to particular ones, a biphenyl type epoxy resin and a trisphenolmethane type epoxy resin may be given as examples of the epoxy resin.

The semiconductor encapsulation material may further contain a curing accelerator to accelerate curing of the thermosetting resin. Although the curing accelerator is not limited to particular ones, triphenylphosphine may be given as an example of the curing accelerator.

The semiconductor encapsulation material may contain an inorganic filler for adjusting the storage modulus, coefficient of thermal expansion, and mechanical strength thereof. If the semiconductor encapsulation material contains an inorganic filler, the content of the inorganic filler falls preferably within the range from 55% by mass to 85% by mass with respect to the total mass of the semiconductor encapsulation material. This further reduces the warpage of the semiconductor device 1.

A lower limit value of the content of the inorganic filler is more preferably 57% by mass or more, and even more preferably 60% by mass or more. Meanwhile, an upper limit value of the content of the inorganic filler is more preferably 83% by mass or less, and even more preferably 80% by mass or less.

The inorganic filler may include magnesium hydroxide and/or aluminum hydroxide. If the semiconductor encapsulation material contains magnesium hydroxide and/or aluminum hydroxide, the content of the magnesium hydroxide and/or aluminum hydroxide is preferably 10% by mass or more with respect to the total mass of the semiconductor encapsulation material. This further reduces the warpage of the semiconductor device 1.

A lower limit value of the content of the magnesium hydroxide and/or aluminum hydroxide is more preferably 11% by mass or more, and even more preferably 12% by mass or more. Meanwhile, an upper limit value of the content of the magnesium hydroxide and/or aluminum hydroxide is preferably 80% by mass or less, more preferably 75% by mass or less, and even more preferably 70% by mass or less.

If the semiconductor encapsulation material contains an inorganic filler, the semiconductor encapsulation material may further contain a silane coupling agent to improve adhesiveness between the thermosetting resin and the inorganic filler. Although the silane coupling agent is not limited to particular ones, 3-glycidoxypropyltrimethoxysilane may be given as an example of the silane coupling agents.

The semiconductor encapsulation material may further contain an ion scavenger to remove a corrosive ion. The ion scavenger is also called an inorganic ion exchanger.

The semiconductor encapsulation material may further contain a pigment to color the encapsulating portion 3. Although the pigment is not limited to particular ones, carbon black may be given as an example of the pigment.

A flexural modulus of a cured product of the semiconductor encapsulation material at 260° C. falls preferably within the range from 0.1 GPa to 0.9 GPa. This further reduces the warpage of the semiconductor device 1. In particular, when the semiconductor device 1 is fabricated by the MAP process, the warpage of the substrate assembly 100 before dicing may be reduced. Reducing the warpage of the substrate assembly 100 allows various subsequent processes on the substrate assembly 100 to proceed smoothly.

A mold shrinkage factor of a cured product of the semiconductor encapsulation material falls preferably within the range from 0.35% to 1.3%. This further reduces the warpage of the semiconductor device 1.

A lower limit value of the mold shrinkage factor is more preferably 0.38% or more, and even more preferably 0.40% or more. Meanwhile, an upper limit value of the mold shrinkage factor is more preferably 1.28% or less, and even more preferably 1.26% or less.

(3) Variations

In the embodiment described above, an FC-CSP is exemplified as the first semiconductor device 11 and a WLP is exemplified as the second semiconductor device 12. However, the semiconductor device 1 is not limited to these types. Examples of other types of semiconductor devices include a module type semiconductor device such as an SiP (System in Package) and a hybrid-type semiconductor device in which wire connection and flip-chip bonding are used in combination.

In the embodiment described above, the third semiconductor device 13 is fabricated by the MAP process. However, the first semiconductor device 11 and the second semiconductor device 12 may also be fabricated by the MAP process.

(Recapitulation)

As can be seen from the foregoing description of embodiments, the present disclosure has the following aspects. In the following description, reference signs are inserted in parentheses just for the sake of clarifying correspondence in constituent elements between the following aspects of the present disclosure and the exemplary embodiments described above.

A semiconductor encapsulation material according to a first aspect is used to fabricate a semiconductor device (1). The semiconductor device (1) includes a semiconductor chip (2) and an encapsulating portion (3). The encapsulating portion (3) is made of a cured product of the semiconductor encapsulation material. The encapsulating portion (3) encapsulates the semiconductor chip (2). A stress index (SI), given by the following Formula (1), of the semiconductor encapsulation material is equal to or more than 8500:

$$SI = \int_{35°C}^{Mold\ temp.} [E'(T) \times CTE(T)] dT \quad (1)$$

In Formula (1), E' (T) represents a storage modulus, CTE (T) represents a coefficient of thermal expansion, and Mold temp. represents a molding temperature.

If a volume of the semiconductor chip (2) is represented by Vc and a total volume of the semiconductor chip (2) and the encapsulating portion (3) is represented by Va, the volume Vc and the total volume Va satisfy the following Formula (2):

$$\frac{Vc}{Va} \geq 0.3. \quad (2)$$

This aspect allows reducing the warpage of the semiconductor device (1).

In a semiconductor encapsulation material according to a second aspect, which may be implemented in conjunction with the first aspect, a flexural modulus of a cured product of the semiconductor encapsulation material at 260° C. falls within the range from 0.1 GPa to 0.9 GPa.

This aspect allows further reducing the warpage of the semiconductor device (1). In particular, when the semiconductor device (1) is fabricated by MAP process, the warpage of a substrate assembly (100) before dicing may be reduced.

In a semiconductor encapsulation material according to a third aspect, which may be implemented in conjunction with the first or second aspect, a mold shrinkage factor of a cured product of the semiconductor encapsulation material falls within the range from 0.35% to 1.3%.

This aspect allows further reducing the warpage of the semiconductor device (1).

A semiconductor encapsulation material according to a fourth aspect, which may be implemented in conjunction with any one of the first to third aspects, contains an inorganic filler. The content of the inorganic filler falls within the range from 55% by mass to 85% by mass with respect to the total mass of the semiconductor encapsulation material.

This aspect allows further reducing the warpage of the semiconductor device (1).

In a semiconductor encapsulation material according to a fifth aspect, which may be implemented in conjunction with the fourth aspect, the inorganic filler includes magnesium hydroxide and/or aluminum hydroxide. The content of the magnesium hydroxide and/or aluminum hydroxide is 10% by mass or more with respect to the total mass of the semiconductor encapsulation material.

This aspect allows further reducing the warpage of the semiconductor device (1).

A semiconductor device (1) according to a sixth aspect includes a semiconductor chip (2) and an encapsulating portion (3) encapsulating the semiconductor chip (2). The encapsulating portion (3) is made of a cured product of the semiconductor encapsulation material according to any one of the first to fifth aspects.

This aspect allows reducing the warpage of the semiconductor device (1).

EXAMPLES

The present disclosure will be described in detail by way of examples. Note that the present disclosure is not limited to the following examples.

1. Semiconductor Encapsulation Material

A semiconductor encapsulation material was obtained by mixing the components shown in the column of "Composition" in Table 1. Note that the details of the components shown in Table 1 are as follows:

Epoxy resin 1: biphenyl type epoxy resin, NC-3000 manufactured by Nippon Kayaku Co., Ltd., having an epoxy equivalent of 265-285 g/eq;

Epoxy resin 2: trisphenol methane type epoxy resin, EPPN-501HY manufactured by Nippon Kayaku Co., Ltd., having an epoxy equivalent of 163-175 g/eq;

Epoxy resin 3: biphenyl type epoxy resin, YX4000 manufactured by Mitsubishi Chemical Corporation, having an epoxy equivalent of 180-192 g/eq;

Phenolic resin 1: MEHC-7851 manufactured by Meiwa Plastic Industries, Ltd., having an OH equivalent of 201-220 g/eq;

Phenolic resin 2: MEHC-7800-M manufactured by Meiwa Plastic Industries, Ltd., having an OH equivalent of 167-180 g/eq;

Inorganic filler 1: silica, FB-5SDC manufactured by Denka Company Limited., having a mean particle size (d50) of 4.1 μm;

Inorganic filler 2: magnesium hydroxide, KISUMA 8SN manufactured by Kyowa Chemical Industry Co., Ltd., having a mean particle size of 1.48 μm;

Pigment: carbon black, MA600 manufactured by Mitsubishi Chemical Corporation, having a particle size of 20 nm (arithmetic mean diameter);

Ion-trapping agent: IXE-700F (Mg, Al based) manufactured by Toagosei Co., Ltd.;

Curing accelerator: triphenylphosphine, Hokuko TPP manufactured by HOKKO CHEMICAL INDUSTRY CO., LTD.; and Silane coupling agent: 3-glycidoxypropyltrimethoxysilane, KBM-403 manufactured by Shin-Etsu Chemical Co., Ltd.

2. Physical Properties (1) Stress Index (DMA)

A test piece (having dimensions of 5 mm×50 mm×1 mm) formed out of the semiconductor encapsulation material had its temperature increased at a rate of 5° C/min. from 25° C to 280° C, and the storage modulus E' (T) (unit: GPa) of the test piece was measured at a frequency of 10 Hz using a thermal mechanical analyzer ("DMA7100" manufactured by Hitachi High-Tech Corporation). Measured values of the storage modulus (E' (T)) were obtained at a step of 5° C from 25° C.

(TMA)

A test piece (having dimensions of φ5 mm×1 mm) formed out of the semiconductor encapsulation material had its temperature increased at a rate of 5° C./min. from 25° C. to 280° C., and the coefficient of thermal expansion (CTE (T)) (unit: ppm/° C.) of the test piece was measured under a load of −1 g using a thermal mechanical analyzer ("TMA7100" manufactured by Hitachi High-Tech Corporation). Measured values of the coefficient of thermal expansion (CTE (T)) were obtained at a step of 5° C. from 25° C.

(Calculation)

To calculate the stress index (SI), the storage modulus E' (T) (GPa) and coefficient of thermal expansion (CTE (T)) (ppm/° C.) values measured at respective temperatures in the range from 35° C. to 175° C. (molding temperature) were used. The respective values, measured at the same temperature, of the storage modulus (E' (T)) and the coefficient of thermal expansion (CTE (T)) were multiplied together to obtain a product. The stress index (SI) was obtained by integrating together these produces. As previously described, the stress index (SI) is an evaluation index and has no particular unit.

(2) Flexural Modulus

The flexural modulus of a test piece (having dimensions of 80 mm×10 mm×4 mm) formed out of the semiconductor encapsulation material was measured at 260° C. using an autograph universal testing machine ("AG-IS" manufactured by SHIMADZU CORPORATION). The flexural modulus was measured under the condition including a distance between fulcrums of 64 mm and a testing rate of 2 mm/min.

(3) Mold Shrinkage Factor

A test piece was formed by transfer molding using the semiconductor encapsulation material. The molding process was carried out under the condition including a die diameter of 80 mm, a die temperature of 175° C., an injection pressure of 6.9 MPa, and a molding time of 150 seconds. The diameter of the test piece thus formed was measured, and the mold shrinkage factor was calculated based on the dimensions of the test piece with respect to the die diameter.

3. Evaluation (1) Substrate Assembly

A substrate assembly 100 as shown in FIG. 3 was fabricated. Specifically, the substrate assembly 100 was obtained by mounting a plurality of (4×16) semiconductor chips 2 on one surface of a single substrate 5 such that each product area included one of the semiconductor chips 2 and by collectively encapsulating these semiconductor chips 2 with the semiconductor encapsulation material. The collective encapsulation was performed by using a molding machine ("FFT" manufactured by TOWA CORPORATION). Other details are as follows:

Substrate: ETS, coreless, having three layers (having residual copper ratios of 55%, 70%, and 60%, respectively);
Length (FS2) of the substrate: 220.0 mm;
Width (FS1) of the substrate: 60.0 mm;
Thickness (ST) of the substrate: 110 μm;
Length of the semiconductor chip: 12.4 mm;
Width of the semiconductor chip: 10.9 mm;
Thickness (DT) of the semiconductor chip: 150 μm;
Volume occupancy of the plurality of semiconductor chips: 42.0% by volume;
Thickness of the die attach film: 15 μm;
Length (MA2) of the encapsulating portion: 213.6 mm;
Width (MA1) of the encapsulating portion: 53.6 mm;
Thickness (MT) of the encapsulating portion: 270 μm; and
Thickness (PT) of the substrate assembly: 380 μm.

(2) Warpage Before Dicing

The substrate assembly 100 was subjected to post curing at 175° C. for six hours. In addition, the substrate assembly 100 was heated in a reflow furnace so that the substrate assembly 100 was kept heated for 1 minute and 30 seconds at a temperature in the range from 160° C. to 200° C. and heated for 10 seconds at 260° C., which was the highest temperature. Then, the substrate assembly 100 was placed on a flat surface to have the respective lifting heights at the four corners thereof measured with a ruler, and the average value of the lifting heights thus measured at the four corners was calculated and regarded as the degree of warpage before dicing. Note that in Table 1, the degree of warpage before dicing in each of Examples 1-5 and Comparative Example 2 is indicated as a relative value on the supposition that the degree of warpage before dicing of Comparative Example 1 is 100% (Ref).

(3) Warpage after Dicing

Sixty-four third semiconductor devices 13 as shown in FIG. 4 were obtained by dicing the substrate assembly 100 into multiple pieces. The coplanarity values of the third semiconductor devices 13 in the temperature range from 25° C. to 260° C. were measured by using a 3D heated surface profile measurement system ("ThermoMoire PS200" manufactured by AKROMETRIC LLC), and the average value of those coplanarity values was calculated and regarded as the degree of warpage after dicing. Note that in Table 1, the degree of warpage before dicing in each of Examples 1-5 and Comparative Example 2 is indicated as a relative value on the supposition that the degree of warpage before dicing of Comparative Example 1 is 100% (Ref). The other details of the third semiconductor device 13 are as follows:

Volume occupancy of the semiconductor chip: 51.9% by volume;
Length of the third semiconductor device: 12.8 mm;
Width of the third semiconductor device: 11.3 mm; and
Thickness (PT) of the third semiconductor device: 270 μm.

TABLE 1

|  |  | Examples ||||| Comparative Examples ||
|---|---|---|---|---|---|---|---|---|
|  |  | 1 | 2 | 3 | 4 | 5 | 1 | 2 |
| Composition (mass %) | Epoxy Resin 1 | 7 | 17 | 5 | 6 | 20 | 16 | 0 |
|  | Epoxy Resin 2 | 6 | 0 | 12 | 6 | 0 | 0 | 0 |
|  | Epoxy Resin 3 | 0 | 0 | 0 | 0 | 2 | 0 | 6 |
|  | Phenolic Resin 1 | 1 | 6 | 6 | 1 | 8 | 3 | 2 |
|  | Phenolic Resin 2 | 5 | 6 | 6 | 4 | 9 | 5 | 2 |
|  | Inorganic Filler 1 | 60 | 70 | 55 | 72 | 30 | 75 | 89 |
|  | Inorganic Filler 2 | 20 | 0 | 15 | 10 | 30 | 0 | 0 |
|  | Pigment | 0.2 | 0.2 | 0.2 | 0.2 | 0.2 | 0.2 | 0.2 |
|  | Ion Trapping Agent | 0.2 | 0.2 | 0.2 | 0.2 | 0.2 | 0.2 | 0.2 |
|  | Curing Accelerator | 0.3 | 0.3 | 0.3 | 0.3 | 0.3 | 0.3 | 0.3 |
|  | Silane Coupling Agent | 0.3 | 0.3 | 0.3 | 0.3 | 0.3 | 0.3 | 0.3 |
| Physical Properties | Stress Index (SI) (35° C.-175° C.) | 13000 | 11000 | 11000 | 11000 | 8900 | 6500 | 6000 |
|  | Flexural Modulus (GPa) at 260° C. | 0.74 | 0.2 | 0.3 | 0.9 | 0.1 | 0.63 | 0.35 |
|  | Mold Shrinkage Factor (%) | 0.4 | 0.68 | 0.67 | 0.35 | 1.1 | 0.5 | 0.2 |
| Evaluation | Degree of Warpage Before Dicing (%) | 90 | 70 | 60 | 91 | 52 | Ref | 118 |
|  | Degree of Warpage After Dicing (%) | 85 | 89 | 81 | 88 | 86 | Ref | 110 |

As can be seen from Table 1, in comparison with the values of stress index (SI) in the Comparative Examples 1, 2, the stress index (SI) in each of Examples 1-5 was equal to or more than 8500. This shows that the warpage before and after dicing was reduced in Examples 1-5. Note that both the warpage before dicing and the warpage after dicing were convex warpages.

REFERENCE SIGNS LIST

1 Semiconductor Device
2 Semiconductor Chip
3 Encapsulating Portion

The invention claimed is:

1. A semiconductor encapsulation material used to fabricate a semiconductor device, the semiconductor device comprising: a semiconductor chip; and an encapsulating portion comprised of a cured product of the semiconductor encapsulation material and encapsulating the semiconductor chip, the semiconductor encapsulation material comprising: a stress index (SI), given by Formula (1), being equal to or more than 8500:

$$SI = \int_{35°C.}^{Mold\ temp.} [E'(T) \times CTE(T)] dT \quad (1)$$

where E'(T) represents a storage modulus of the semiconductor encapsulation material at a temperature T, CTE(T) represents a coefficient of thermal expansion of the semiconductor encapsulation material at the temperature T, dT is a symbol indicative of a definite integral, and Mold temp. represents a molding temperature of the semiconductor encapsulation material, and when a volume of the semiconductor chip is represented by Vc and a total volume of the semiconductor chip and the encapsulating portion is represented by Va, the volume Vc and the total volume Va satisfy Formula (2):

$$\frac{Vc}{Va} \geq 0.3. \quad (2)$$

2. The semiconductor encapsulation material of claim 1, wherein a flexural modulus of the cured product of the semiconductor encapsulation material at 260° C. is within a range from 0.1 GPa to 0.9 GPa.

3. The semiconductor encapsulation material of claim 1, wherein
a mold shrinkage factor of the cured product of the semiconductor encapsulation material is within a range from 0.35% to 1.3%.

4. The semiconductor encapsulation material of claim 1, wherein
the semiconductor encapsulation material contains an inorganic filler, and
a content of the inorganic filler is within a range from 55% by mass to 85% by mass with respect to a total mass of the semiconductor encapsulation material.

5. The semiconductor encapsulation material of claim 4, wherein
the inorganic filler includes at least one of magnesium hydroxide or aluminum hydroxide, and
a content of the at least one of magnesium hydroxide or aluminum hydroxide is 10% by mass or more with respect to the total mass of the semiconductor encapsulation material.

6. A semiconductor device, comprising:
the semiconductor chip; and
the encapsulating portion encapsulating the semiconductor chip,
wherein the encapsulating portion includes the cured product of the semiconductor encapsulation material of claim 1.

* * * * *